United States Patent [19]

Fujie

[11] Patent Number: 4,611,136
[45] Date of Patent: Sep. 9, 1986

[54] SIGNAL DELAY GENERATING CIRCUIT

[75] Inventor: Norikazu Fujie, Yamanashi, Japan

[73] Assignee: Pioneer Electronic Corporation, Tokyo, Japan

[21] Appl. No.: 561,439

[22] Filed: Dec. 14, 1983

[30] Foreign Application Priority Data

Dec. 14, 1982 [JP]  Japan ................. 57-217769

[51] Int. Cl.[4] .......... H03K 5/13; H03K 5/04; H03K 5/05
[52] U.S. Cl. .................. 307/603; 307/591; 307/597; 328/55; 328/58
[58] Field of Search ............ 307/591, 593, 597, 603; 328/55, 58, 67

[56] References Cited

U.S. PATENT DOCUMENTS

| 3,742,257 | 6/1973 | Wittenzeller | 307/273 |
| 3,906,247 | 9/1975 | Heffner | 307/293 |
| 4,230,970 | 10/1980 | Potter et al. | 317/307 |
| 4,429,236 | 1/1984 | Nitschke | 307/362 |

FOREIGN PATENT DOCUMENTS 173226  10/1982  Japan .

OTHER PUBLICATIONS

"On-Off Timer for Battery Powered Systems", by P. A. Martinez and J. Barquillas, Electronic Engineering, Mar. 1980.

Primary Examiner—Stanley D. Miller
Assistant Examiner—Richard Roseen
Attorney, Agent, or Firm—Sughrue, Mion, Zinn, Macpeak, and Seas

[57] ABSTRACT

A signal generating circuit for generating a delayed signal in response to a pulsed timing signal with a delay time which is not substantially affected by variations in supply voltage or temperature. A voltage comparator receives a first input from a voltage division point of a voltage dividing circuit coupled across a voltage source. The other input terminal of the comparator is coupled to a RC circuit and to one terminal of a switch, the other terminal of which is connected to the voltage source. The position of the switch is determined by the output of the timing signal source. If desired, a flip-flop having its set input terminal coupled to a periodic pulse source and its reset input terminal coupled to the output of the comparator may have its complementary output used as the timing signal source to the switch, with the normal output of the flip-flop providing the delayed signal. Alternatively, a pair of comparators may be provided, each comparator comparing the RC circuit voltage to a different voltage from different points on the voltage dividing circuit, with the comparator outputs and the switching signal being combined in a logic circuit to obtain the delayed signal.

5 Claims, 11 Drawing Figures

SIGNAL DELAY GENERATING CIRCUIT

BACKGROUND OF THE INVENTION

The present invention relates to an accurate signal generating circuit which can be manufactured in the form of an integrated circuit.

A conventional signal generating circuit of the same general type to which the invention pertains is shown in FIG. 1A. In FIG. 1A, reference numeral 1 designates a timing pulse signal generating circuit; 2, a comparison circuit; $R_1$ and $R_2$, comparison voltage generating resistors; $V_1$, a comparison voltage; $Q_1$, a switching transistor; R, a timing resistor which is externally connected to the circuit; and C, a timing capacitor which is also externally connected to the circuit.

When the timing signal generating circuit produces a pulse of a signal $S_1$, the switching transistor $Q_1$ is turned on and the voltage at the circuit point $S_2$ becomes the collector saturation voltage $V_{CES}$ of the transistor $Q_1$, as shown in FIG. 1B. When the signal $S_1$ returns to the low level, the switching transistor $Q_1$ is rendered nonconductive. As a result, a charging current flows through the capacitor C via the resistor R. In this case, the voltage E at the circuit point $S_2$ can be represented by the following expression:

$$E = V_{cc}(1 - e^{-t/RC}) + V_{CES}.$$

The period of time T required for establishing $E = V_1$ is:

$$T = RC \log_e (1 - (V_1 - V_{CES})/V_{cc}).$$

When E becomes equal to $V_1$, the state of the comparison circuit 2 is changed and the comparison circuit provides an active output.

In the conventional signal generating circuit designed as described above, the period of time T required for the voltage at the circuit point $S_2$ to become equal to the comparison voltage includes terms of the supply voltage $V_{cc}$ and the collector saturation voltage $V_{CES}$. Accordingly, the period of time T is affected by variations of the supply voltage $V_{cc}$ and the variations in the collector saturation voltage $V_{CES}$. Temperature changes also affect T. Therefore, it is impossible to determine the period of time T with a high accuracy. This is especially difficult in a low voltage circuit operating from a low supply voltage.

An object of the invention is to overcome the above-described difficulties accompanying a conventional signal generating circuit. More specifically, an object of the invention is to provide an accurate signal generating circuit which is not affected by variations of the supply voltage and temperature or by variations in characteristics among transistors, which has a simple circuit arrangement, and is suitable for manufacturing in the form of an integrated circuit.

SUMMARY OF THE INVENTION

In accordance with the above and other objects of the invention, there is provided a temperature-stable signal generating circuit, adapted for manufacture in the form of an integrated circuit, including a differential amplifier driven by a timing signal. A comparison voltage, applied to one input terminal of a comparison circuit, is provided by resistively voltage dividing a DC power source voltage. The differential amplifier is enabled by the timing signal to connect the DC source to the RC time constant circuit. The voltage across the time constant circuit is applied to a second input of the comparison circuit.

DESCRIPTION OF THE PREFERRED EMBODIMENTS

The invention will now be described in further detail with reference to FIGS. 2A through 7B.

Figure 1A:
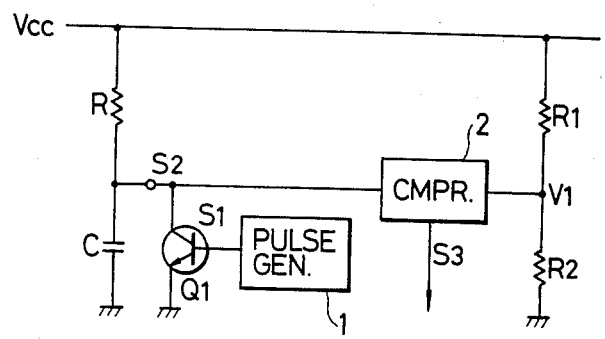
FIG. 1A is a circuit diagram showing a conventional signal generating circuit.
Figure 1B:
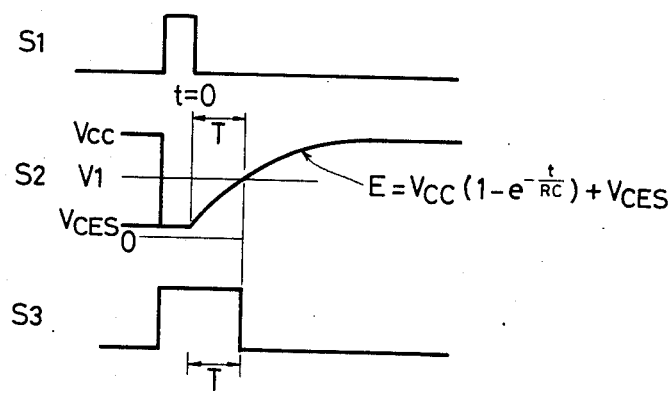
FIG. 1B is a waveform diagram used for a description of the operation of the circuit shown in FIG. 1A.
Figure 2A:
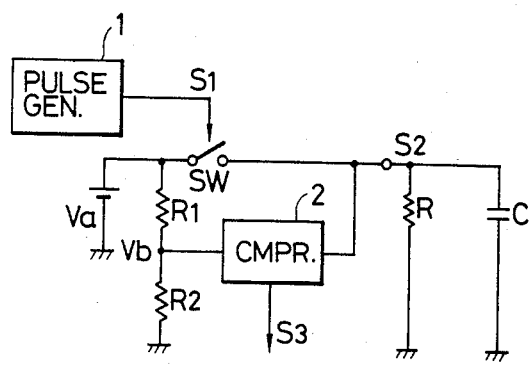
FIG. 2A is a circuit diagram showing the basic arrangement of a signal generating circuit according to the invention.
Figure 2B:
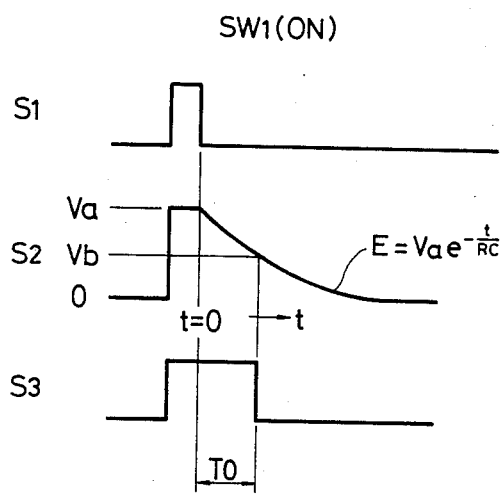
FIG. 2B is a waveform diagram used for a description of the operation of the circuit of FIG. 2A.

FIG. 2A is a block diagram showing the basic arrangement of a signal generating circuit according to the invention, and FIG. 2B is a timing chart showing voltage waveforms at various circuit points in the circuit of FIG. 2A.

In FIG. 2A, reference character $V_a$ designates a reference voltage; $V_b$, a comparison voltage; and SW, a switch.

When a timing signal generating circuit 1 outputs a pulse of a signal $S_1$, the switch SW is turned on, as shown in FIG. 2B, so that a charging current flows through an externally connected capacitor. At that time, the voltage E at the circuit point $S_2$ is equal to the reference voltage Va. In this case, a comparison circuit 2 provides an output $S_3$. When the signal $S_1$ returns to the low level, the switch SW is turned off. The discharge current of the capacitor C flows through an externally connected resistor R. In this case, the voltage E at the circuit point $S_2$ is:

$$E = V_a e^{-t/RC}.$$

The time $T_0$ required for the voltage E to become equal to the comparison voltage $V_b$ is:

$$T_0 = -RC \log_e (V_b/V_a).$$

where:

$$V_b = (R_2/(R_1 + R_2)) V_a.$$

Therefore:

$$T_0 = -RC \log_e (R_2/(R_1 + R_2)).$$

That is, the time $T_0$ is determined by the resistance values of the comparison resistors $R_1$ and $R_2$ and the capacitance value of the capacitor C only, and is independent of the absolute values of the voltages $V_a$ and $V_b$. The time $T_0$ can of course easily be changed by adjusting the values of the externally connected resistor R and the externally connected capacitor C.

Figure 3:
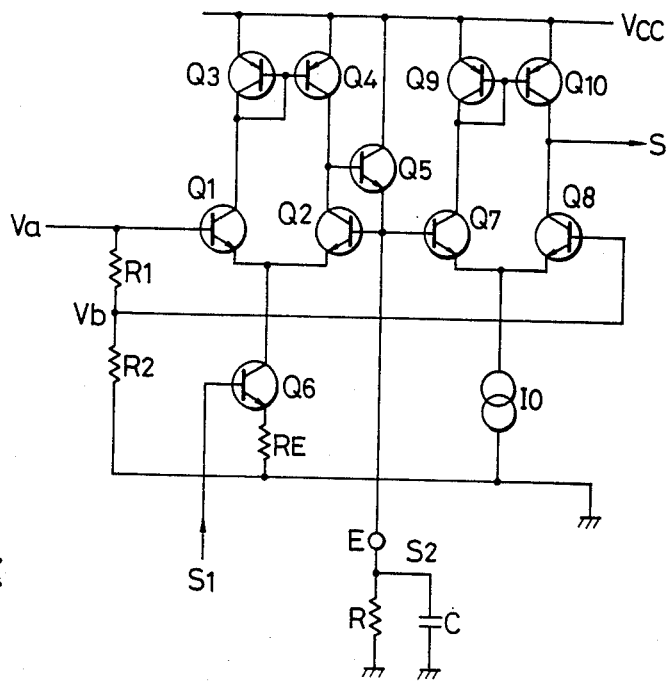
FIG. 3 is a circuit diagram showing a detailed example of the signal generating circuit of FIGS. 2A and 6A.

An example of a signal generating circuit according to the invention will now be described with reference to FIG. 3. In FIG. 3, transistors $Q_1$ and $Q_2$ form a differential pair which is driven by a constant current circuit including a transistor $Q_6$. Transistors $Q_3$ and $Q_4$ form a current mirror circuit. That is, the transistor $Q_4$ passes a current which is equal to that which the transistor $Q_3$ passes.

A transistor $Q_5$ is used for current amplification, applying current to an externally connected resistor R and an externally connected capacitor C. The transistors $Q_1$ through $Q_5$ form a 100% negaive feedback amplifier driven by the transistor $Q_6$, which operates as a constant voltage source and a switch.

Transistors $Q_7$ and $Q_8$ form a differential pair which is driven by a current source $I_0$. Transistors $Q_9$ and $Q_{10}$ form a current mirror circuit. That is, the transistor $Q_{10}$ passes a current which is equal to that which the transistor $Q_9$ passes. The transistors $Q_7$ through $Q_{10}$ and the current source $I_0$ form an amplifier circuit which has an extremely large voltage gain. The amplifier serves as the voltage comparison circuit 2.

In FIG. 3, reference character $V_a$ designates an internally produced reference voltage having a suitable value. Further in FIG. 3, reference character $S_1$ designates a timing signal used for charge and discharge control. When the timing signal $S_1$ is raised to the high level, the transistor $Q_6$ is driven to cause the differential amplifier to be operated. The voltage at the base of the transistor $Q_2$, that is, the voltage at the external connecting terminal, becomes equal to the voltage at the base of the transistor $Q_1$, namely, the reference voltage $V_a$. In this case, current is supplied through the transistor $Q_5$ to an extremely connected resistor R and an externally connected capacitor C. The transistor $Q_5$ has a capacity large enough to quickly charge the capacitor C.

When the signal $S_1$ is set to the low level, the driving of the transistor $Q_6$ is suspended. As a result, all the transistors $Q_1$ through $Q_5$ are rendered nonconductive and the capacitor C is discharged. In this case, the voltage E at the circuit point $S_2$ is:

$$E = V_a e^{-t/RC}.$$

The error component is only the base current of the transistor $Q_7$. The error can be made insignificantly small by using a transistor having a sufficiently high $h_{fE}$ or by employing Darlington-connected transistor.

The comparison voltage $V_b$ is applied to the base of the transistor $Q_8$ in the voltage comparison circuit 2. When $E = V_b$, the output $S_3$ is set to the low level. The time $T_0$ required for the voltage E to become equal to the comparison voltage $V_b$ is:

$$T_0 = -RC \log_e (R_2/(R_1+R_2)).$$

Accordingly, even if the reference voltage $V_a$ varies with temperature or the supply voltage, the time $T_0$ is not at all affected thereby.

One factor affecting the time $T_0$ is $R_2/(R_1+R_2)$. Variations of these resistances can be compensated for by using a variable resistor as the externally connected resistor R. That is, the variations can be compensated for by adjusting a variable resistor. The resistors $R_1$ and $R_2$ have the same temperature characteristic because they are IC internal resistors. Therefore, once the adjustment of the variable resistor is made, the time $T_0$ will not be affected by temperature changes.

Another factor affecting $T_0$ is the product RC. However, this effect can be eliminated by using a resistor and a capacitor which have very stable temperature characteristics.

Figure 4:
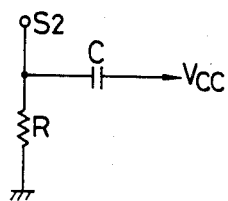
FIGS. 4 and 5 are circuit diagrams showing modifications of the signal generating circuit of FIG. 3.

The externally connected capacitor C may be connected to the power source $V_{cc}$ as shown in FIG. 4. However, it should be noted that, in this case, the operation of the circuit is affected by the ripple component of the power source.

Figure 5:
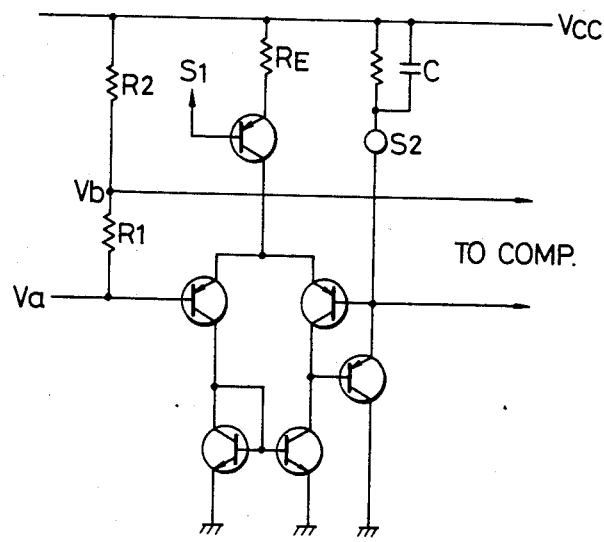

The signal generating circuit may be modified as shown in FIG. 5 wherein, instead of NPN transistors and PNP transistors as employed in the arrangement of FIG. 3, the opposite conductivity types are employed, that is, PNP transistors and NPN transistors are employed, respectively.

Figure 6A:
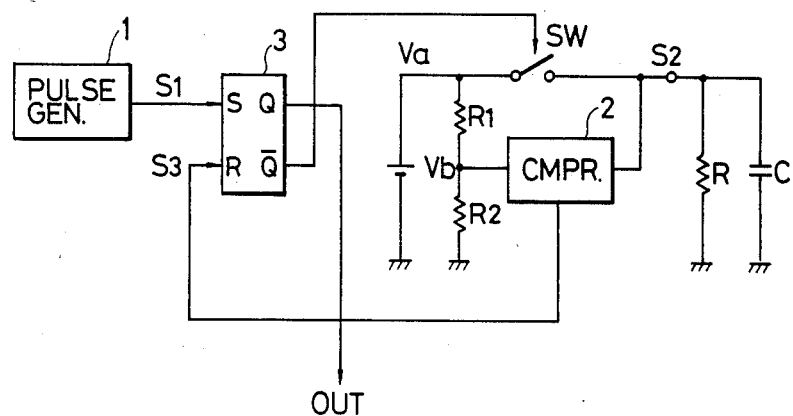
FIG. 6A is a circuit diagram showing another modification of a signal generating circuit according to the invention.
Figure 6B:
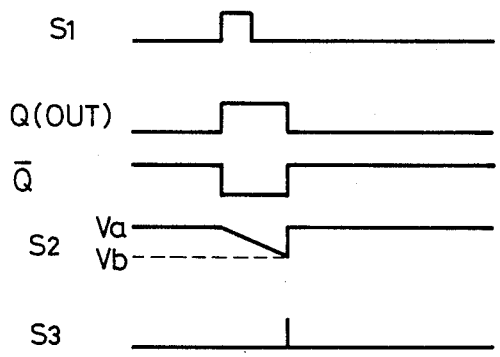
FIG. 6B is a waveform diagram used for a description of the operation of the circuit of FIG. 6A.

FIG. 6A shows another example of a signal generating circuit of the invention. This embodiment is formed by adding an R-S flip-flop 3 to the circuit of FIG. 2A or 3. In this example, the time from the leading edge of the timing signal can be set as shown in FIG. 6B.

The R-S flip-flop 3 is set by the timing signal $S_{1A}$ to raise the Q output signal OUT to a high level. The $\overline{Q}$ signal of the flip-flop 3 turns off the switch SW to cause the capacitor C to be discharged. When the voltage at the circuit point $S_2$ becomes equal to the comparison voltge $V_b$, the output $S_3$ of the voltage comparison circuit 2 is raised to the high level to thus reset the R-S flip-flop 3 and lower the Q output signal OUT. Therefore, the $\overline{Q}$ signal is raised to the high level to turn on the switch SW, thus charging the capacitor C. Accordingly, the level of the output $S_3$ is quickly changed and the capacitor is maintained charged until the next pulse of the signal $S_1$ is applied to the circuit.

Figure 7A:
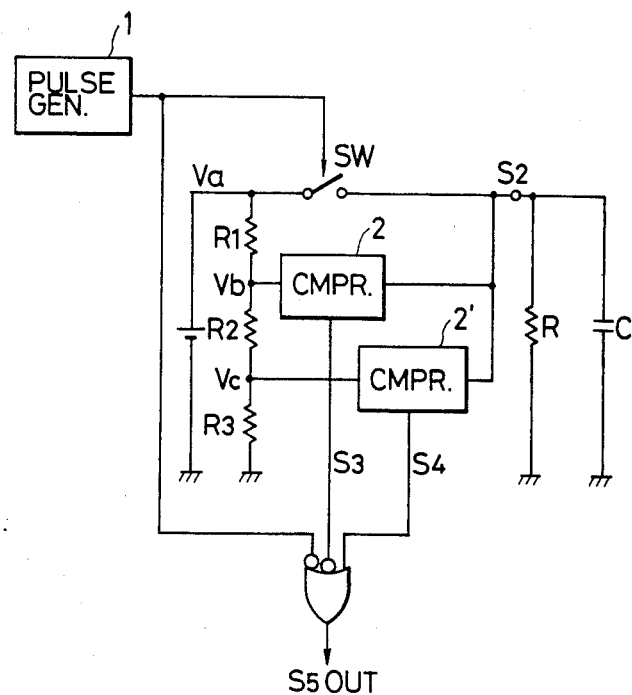
FIG. 7A is also a circuit diagram showing another modification of a signal generating circuit according to the invention.
Figure 7B:
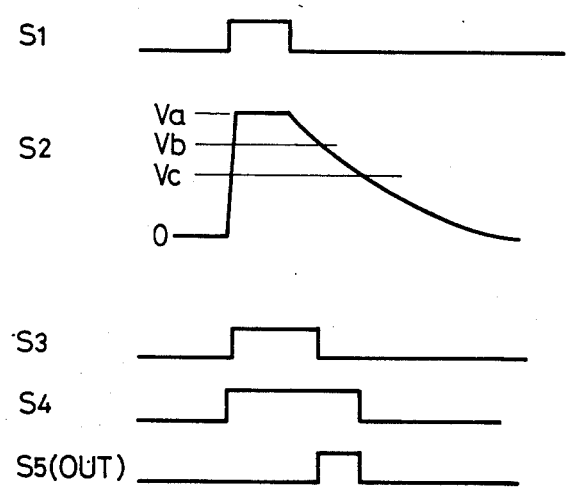
FIG. 7B is a waveform diagram used for a description of the operation of the circuit of FIG. 7A.

FIG. 7A shows still another example of a signal generating circuit of the invention. In this case, two voltage comparison circits 2 and 2' form a window comparator with which a pulse is generated with a delay time from the occurrence of a trigger signal as shown in FIG. 7B.

The circuit of FIG. 7 can be used for generating keying signals for keyed clamping of a video signal.

As is apparent from the above description, the signal generating circuit of the invention is not affected by variations of the supply voltage, and is temperature-compensated, even in the case where the temperature of the interior of the IC is different from that of the exterior. Therefore, in the circuit of the invention, the time constant can be determined with a considerably high accuracy.

The signal generating circuit of the invention has a simple configuration, and has only one external connecting terminal.

I claim:

1. A signal generating circuit, comprising:
   a reference voltage source having first and second terminals and producing a reference voltage at its first terminal;
   a differential amplifier having first and second inputs and an output and enabled by a timing signal, said first input of said differential amplifier being coupled to said first terminal of said reference voltage source;

a parallel RC circuit having a first terminal coupled to said second input of said differential amplifier and having a second terminal coupled to said second terminal of said reference voltage source;

means for providing a charging voltage to said first terminal of said parallel RC circuit in response to an output from said differential amplifier;

resistive voltage dividing means for voltage dividing an output voltage of said reference voltage source to generate a second reference voltage;

timing signal producing means for producing said timing signal for enabling said differential amplifier; and comparing means for comparing said second reference voltage and a voltage across said parallel RC circuit and producing a signal generating circuit output signal as a result thereof.

2. A signal generating circuit, comprising;

a switchable constant current source controlled by a timing signal;

a first differential amplifier receiving operating current from said switchable constant current source and having one input coupled to a reference voltage source and having different amplifier outputs;

a first current mirror circuit coupled to said outputs of said differential amplifier;

a parallel RC circuit;

a current amplifier having an input coupled to one of said outputs of said differential amplifier and an output coupled to said RC circuit and to a second input of said first differential amplifier;

a voltage dividing circuit for producing at an output thereof a signal by voltage dividing a reference voltage produced by said reference voltage source;

a second differential amplifier having outputs and having a first input coupled to said output of said current amplifier and a second input coupled to said output of said voltage dividing circuit, one of said outputs of said second differential amplifier comprising an output of said signal generating circuit; and a second current mirror circuit coupled to said outputs of said second differential amplifier.

3. A signal generating circuit, comprising;

a first transistor of a first conductivity type having a base receiving a first reference signal;

a second transistor of said first conductivity type having an emitter coupled to an emitter of said first transistor;

a third transistor of a second conductivity type having a base and collector coupled to collector of said first transistor and an emitter coupled to a first terminal of a voltage source;

a fourth transistor of said second conductivity type having a collector coupled to a collector of said second transistor, a base coupled to said base of said third transistor, and an emitter coupled to said first terminal of said source;

a fifth transistor of said first conductivity type having a base coupled to said collector said of second transistor, a collector coupled to said first terminal of said source, and an emitter coupled to a base of said second transistor;

a parallel RC circuit having a first terminal coupled to said emitter of said fifth transistor and a second terminal coupled to a second terminal of said voltage source;

a sixth transistor of said first conductivity type having a collector coupled to emitters of said first and second transistors and a base coupled to a source of a timing signal;

a first resistor coupled between an emitter of said sixth transistor and said second terminal of said voltage source;

second and third series-connected resistors coupled between said base of said first transistor and said second terminal of said voltage source;

constant current source having a first terminal coupled to said second terminal of said voltage source;

a seventh transistor of said first conductivity type having a base coupled to said emitter of said fifth transistor and an emitter coupled to a second terminal of said current source;

an eighth transistor of said first conductivity type having a base coupled to a junction point of said second and third resistors and an emitter coupled to said emitter of said seventh transistor;

a ninth transistor of said second conductivity type having a base and collector coupled to a collector of said seventh transistor and an emitter coupled to said first terminal of said voltage source; and a tenth transistor of said second conductivity type having a collector coupled to a collector of said eighth transistor, a base coupled to said base of said of ninth transistor, and an emitter coupled to said first terminal of said voltage source, an output signal from said signal generating circuit being provided at said collectors of said eighth and tenth transistors.

4. A signal generating circuit, comprising;

a voltage source having first and second terminals and having a first potential at its first terminal;

an RS flip-flop with an S input of said RS flip-flop being coupled to a source of a timing signal;

a differential amplifier having first and second inputs and an output and enabled by a $\overline{Q}$ output of said RS flip-flop, said first input of said differential amplifier being coupled to a first terminal of said voltage source;

first and second resistors coupled in series between said first and second terminals of said voltage source;

a parallel RC circuit having a first terminal coupled to said second terminal of said voltage source and a second terminal coupled to said second input of said differential amplifier;

means for providing said first potential to said second terminal of said parallel RC circuit in response to an output from said differential amplifier; and a comparison circuit having a first input terminal coupled to said second terminal of said parallel RC circuit, a second input terminal coupled to a common point of said first and second resistors of said first and second resistors and an output terminal coupled to an R input of said RS flip-flop, an output of said signal generating circuit being provided at a Q output of said RS flip-flop.

5. A signal generating circuit, comprising: a switch, the operative position of which is controlled by a timing signal source; first through third resistors coupled in series with one another between first and second terminals of a voltage source said first terminal of said voltage source being coupled to a first terminal of said switch; a parallel RC circuit having a first terminal coupled to a second terminal of said switch and a second terminal coupled to said second terminal of said voltage source; a first comparator having a first input coupled to a junction point between said first and second resistors and a second input coupled to said second terminal of said switch; a second comparator having a first input coupled to a junction between said second and third resistors and a second terminal coupled to said second terminal of said switch; and an OR gate having an inverting first input coupled to an output of said timing signal source, an inverting second input coupled to an output of said first comparator, and a noninverting third input coupled to an output of said second comparator, an output of said signal generating circuit being provided at an output of said OR gate.

* * * * *